United States Patent [19]

Nagano

[11] Patent Number: 4,511,913
[45] Date of Patent: Apr. 16, 1985

[54] GATE-TURN OFF THYRISTOR WITH OPTIMIZED ANODE SHORTING RESISTANCE, $R_{so}$

[75] Inventor: Takahiro Nagano, Hitachi, Japan

[73] Assignee: Hitachi, Ltd., Tokyo, Japan

[21] Appl. No.: 267,676

[22] Filed: May 27, 1981

Related U.S. Application Data

[63] Continuation-in-part of Ser. No. 13,808, Feb. 22, 1979, abandoned.

[30] Foreign Application Priority Data

Feb. 22, 1978 [JP] Japan .................................. 53-18484

[51] Int. Cl.³ ............................................ H01L 29/74
[52] U.S. Cl. ........................................ 357/38; 357/35; 357/51; 357/86
[58] Field of Search ........................ 357/38, 86, 51, 35

[56] References Cited

U.S. PATENT DOCUMENTS 3,303,360 2/1967 Gentry .................................. 357/38
3,324,359 6/1967 Gentry .................................. 357/38

Primary Examiner—Joseph E. Clawson, Jr.
Attorney, Agent, or Firm—Antonelli, Terry & Wands

[57] ABSTRACT

There is provided a gate turn-off thyristor comprising at least one gate turn-off thyristor unit formed in a semiconductor substrate, each unit including therein four semiconductor layers having alternately different conductivity types, a first main electrode kept in ohmic contact with a first outermost semiconductor layer, a control electrode kept in ohmic contact with a first inner semiconductor layer adjacent to said first outermost layer and a second main electrode kept in ohmic contact with a second outermost semiconductor layer and a second inner semiconductor layer adjacent to said second outermost layer, wherein the short-circuiting resistance in said second inner layer resulting from short-circuiting said second outermost layer with said second inner layer by said second main electrode is set within a certain range determined by the carrier lifetime the thickness and the resistivity of the second inner layer. Accordingly, a good turn-off performance can be obtained without doping the substrate with life-time killer to increase carrier recombination centers. Further, problems arising from the doping of life-time killer such as the increases in the on-state voltage and the leakage current, the deteriorations at high temperatures of the breakover voltage and the turn-off performance, the decrease in the production yield and the difficulty in increasing the device capacity, can be eliminated.

10 Claims, 13 Drawing Figures

GATE-TURN OFF THYRISTOR WITH OPTIMIZED ANODE SHORTING RESISTANCE, $R_{so}$

CROSS REFERENCE TO RELATED APPLICATION

This application is a continuation-in-part application of U.S. patent Ser. No. 13,808 filed on Feb. 22, 1979.

BACKGROUND OF THE INVENTION

This invention relates to a semiconductor switching device which can control the on-state (conducting state) and the off-state (non-conducting state) and more particularly to a gate turn-off thyristor. A transistor and a gate turn-off thyristor are well known as examples of semiconductor switching devices capable of turning a load current on and off in response to a control signal. Such semiconductor switching devices have some drawbacks as well as advantages. A gate turn-off thyristor (hereafter referred to also as GTO) is more suitable for the treatment or control of large power with a voltage higher than 600 V and a current greater than 30 A since it usually has a large over-load current capability.

A GTO comprises a single or plural GTO units formed in a semiconductor substrate, each GTO unit comprising four semiconductor layers having alternately different conductivity types and superposed one upon another, a pair of main electrodes kept in ohmic contact with the two outermost semiconductor layers, and a control electrode kept in ohmic contact with one of the two inner semiconductor layers. To obtain a large turn-off gain $\beta_{OFF}$ or to shorten turn-off time, it is customary with most of the GTO's on the market to dope their semiconductor substrates with life-time killer such as gold or to irradiate them by electron beams which create carrier recombination centers, so as to shorten the life-time of the carriers. However, if a semiconductor substrate is doped with life-time killer, then the voltage $V_T$ in the on-state across the device becomes high, the leakage current $I_L$ increases, and the breakover voltage and the turn-off performance deteriorate at high temperatures. Further, since the diffusion of gold atoms into the semiconductor substrate is largely affected by the lattice defects and the strains in the substrate, it is difficult to dope gold atoms uniformly into the substrate. This leads to a decrease in the yield and the difficulty in increasing capacity.

SUMMARY OF THE INVENTION

One object of this invention is to provide a semiconductor switching device which exhibits a good turn-off performance without doping the substrate with life-time killer.

Another object of this invention is to provide a semiconductor switching device having a low on-state voltage $V_T$, a small leakage current $I_L$ and a high breakover voltage and a good gate turn-off performance at high temperatures.

Yet another object of this invention is to provide a semiconductor switching device which can be produced at high yields and have a large capacity.

According to the semiconductor switching device embodying this invention, one of the inner semiconductor layers of the GTO unit which has no control electrode attached thereto is kept in ohmic contact with the main electrode provided on the adjacent outermost layer; the short-circuiting resistance in the inner layer without control electrode is within a certain range determined by the geometrical factors of the two outermost layers, without doping any life-time killer into the substrate; and the charge attenuation factor in the inner layer without control electrode is nearly equal to that of a GTO in which life-time killer is doped and one of the two inner layers without control electrode is not kept in ohmic contact with the main electrode provided on the adjacent outermost layer.

DESCRIPTION OF THE PREFERRED EMBODIMENTS

Figure 1:
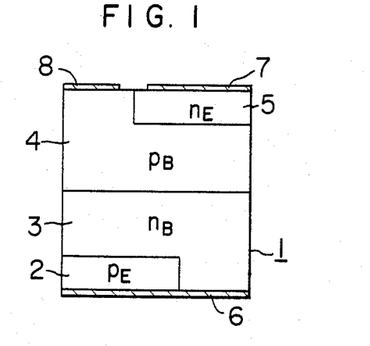
FIG. 1 schematically shows in cross section the fundamental structure of a GTO unit according to this invention.

As seen in FIG. 1, a semiconductor substrate 1 comprises four semiconductor layers having alternately different conductivity types, i.e. $p_E$-layer 2, $n_B$-layer 3, $p_B$-layer 4 and $n_E$-layer 5. The outermost semiconductor layers, i.e. $p_E$-layer 2 and $n_E$-layer 5, are provided respectively with a pair of main electrodes, i.e. anode electrode 6 and cathode electrode 7, the anode and cathode electrodes being kept in ohmic contact with the $p_E$-layer 2 and the $n_E$-layer 5.

A control electrode, i.e. gate electrode 8, is attached to and kept in ohmic contact with one of the two inner semiconductor layers, i.e. $p_B$-layer 4. The other inner semiconductor layer without control or gate electrode, i.e. $n_B$-layer 3, is kept in ohmic contact with the anode electrode 6 and therefore short-circuited with the adjacent outermost semiconductor layer, i.e. $p_E$-layer 2. The semiconductor substrate 1 is not doped with life-time killer such as gold.

Figure 2:
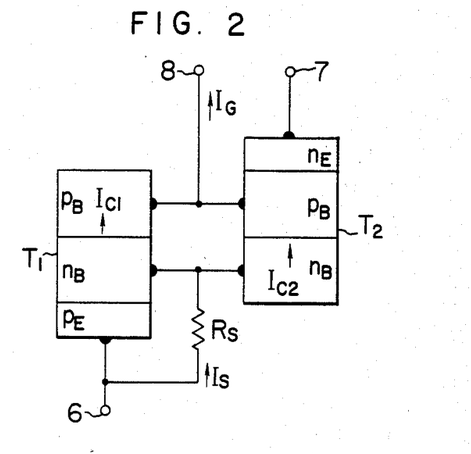
FIG. 2 is an equivalent circuit of the GTO unit shown in FIG. 1.

An equivalent circuit for the GTO unit shown in FIG. 1 modified into a model shown in FIG. 2. In FIG. 2, a first transistor $T_1$ comprises a $p_E$-layer 2, an $n_B$-layer 3 and a $p_B$-layer 4 and a second transistor $T_2$ comprises an $n_B$-layer 3, a $p_B$-layer 4 and an $n_E$-layer 5. A resistance $R_S$ is the resistance of the $n_B$-layer 3 taken into consideration since the $p_E$-layer 2 is short-circuited with the $n_B$-layer 3 by the anode electrode 6. A resistance $R_{so}$ is a normalized value in merits of $\Omega \cdot cm^2$ determined from the resistance $R_s$ and the total area of the $n_B$-layer 3 parallel to the electrodes 6 and 7.

According to the equivalent circuit shown in FIG. 2, the charge-control equations associated with these transistors $T_1$ and $T_2$ are given as follows.

$$\frac{dQ_{B1}}{dt} + \frac{Q_{B1}}{\tau_{B1}} = I_{C2} - I_{S0} \quad (1)$$

$$\frac{dQ_{B2}}{dt} + \frac{Q_{B2}}{\tau_{B2}} = I_{C1} - I_{G0}, \quad (2)$$

where $Q_{B1}$ is the quantity of charges in the $n_B$-layer per unit area, $Q_{B2}$ the quantity of charges in the $p_B$-layer per unit area, $\tau_{B1}$ the life-time of carriers in the $n_B$-layer, $\tau_{B2}$ the life-time of carriers in the $p_B$-layer, $I_{SO}$ the current density through a short-circuiting resistance of the $n_B$-layer, $I_{GO}$ the gate current density, $I_{C1}$ the collector current density of the transistor $T_1$, and $I_{C2}$ the collector current density of the transistor $T_2$.

According to the inventor's research, the effect has been observed that if the $p_E$-layer 2 is short-circuited with the $n_B$-layer 3 by the anode electrode 6, the current amplification factor of the first transistor $T_1$ falls and also the carriers stored in the $n_B$-layer 3 are drawn out through the anode electrode 6. The turn-off performance is improved when the effect of drawing carriers out of the $n_B$-layer 3 increases. Accordingly, the equation (1) given above will be further investigated.

The transformation of the equation (1) yields $$\frac{dQ_{B1}}{dt} = I_{C2} - \left(\frac{Q_{B1}}{\tau_{B1}} + I_{so}\right). \quad (3)$$

In view of the second term of the right-hand side of the equation (3), it is observed that $I_{SO}$ has the same sign as that of $Q_{B1}/\tau_{B1}$ and serves, like the term $Q_{B1}/\tau_{B1}$, to decrease the charge quantity $Q_{B1}$. In fact, the greater the value of the second term becomes, the swifter is the reduction of charge quantity $Q_{B1}$ and the better the turn-off performance becomes. Therefore, the charge attenuation factor represented as the above mentioned second term should be further investigated.

The current $I_{SO}$ through a short-circuiting resistance in the $n_B$-layer is represented as follows.

$$I_{so} = \frac{V_{10} - V_1}{R_{sx}}, \quad (4)$$

where $V_{10}$ is the potential barrier formed by the pn junction between the $p_E$-layer 2 and the $n_B$-layer 3 in the thermal equilibrium, i.e. in the off-state, $V_1$ the bias voltage (forward bias is regarded as positive) to the pn junction and $R_{sx}$ the effective short-circuiting resistance in the operating condition. The effective short-circuiting resistance $R_{sx}$ is the modulated version of the value $R_{so}$ which $R_{SO}$ takes in thermal equilibrium depending on the resistivity $\rho_n$ and the thickness W of the $n_B$-layer 3 and the geometrical patterns of the $p_E$-layer 2 and the $n_E$-layer 5. That is to say, $R_{sx}$ is derived through the modulation of the value $R_{so}$ with the quantity $Q_{B1}$ of the charges stored in the $n_B$-layer 3 and represented by the following expression.

$$R_{sx} = R_{so} \frac{Q_o}{Q_o + Q_{B1}}, \quad (5)$$

where $Q_o$ is the effective charge quantity in the $n_B$-layer 3 in thermal equilibrium.

By virtue of (4) and (5), the expression (3) can be modified as follows.

$$\frac{dQ_{B1}}{dt} = I_{C2} - \left(\frac{Q_{B1}}{\tau_{B1}} + \frac{V_{10} - V_1}{R_{so}} \cdot \frac{Q_o + Q_{B1}}{Q_o}\right) \quad (6)$$

On the other hand, no short-circuiting current flows through the conventional GTO in which the life-time of the carriers in the $n_B$-layer is made small by doping life-time killer such as gold and in which the $p_E$-layer is not short-circuited with the $n_B$-layer by the anode electrode. Therefore, with such a conventional GTO, the charge control equations associated with the transistor comprising a $p_E$-layer, an $n_B$-layer and a $p_B$-layer are as follows.

$$\frac{dQ_{B1}}{dt} + \frac{Q_{B1}}{\tau_{B1}} = I_{C2} \quad (7)$$

$$\frac{dQ_{B1}}{dt} = I_{C2} - \frac{Q_{B1}}{\tau_{B1}} \quad (8)$$

Conventional GTO's on the market can be said to have a desired turn-off performance, except for a problem resulting from the doped life-time killer.

It can therefore be considered that if the second term on the right-hand side of the equation (6) is made approximately equal to the second term on the right-hand side of the equation (8), that is, if both the charge attenuation factors are nearly equal to each other, the GTO according to this invention also has a desired turn-off performance.

Accordingly, the value $R_{so}$ in the off-state, i.e. in the thermal equilibrium, which appears in the second term on the right-hand side of the equation (6), will further be investigated.

As seen from FIG. 1 and the expression (6), if the short-circuiting resistance $R_{so}$ is too small, most of the main current becomes the short-circuiting current so that the first transistor $T_1$ does not operate and that the GTO can no longer self-hold the on-state. Therefore, in order for the GTO to have its proper function, the resistance $R_{so}$ must have a minimum value.

On the other hand, if the short-circuiting resistance $R_{so}$ is too large, the first transistor $T_1$ operates and the carriers in the $n_B$-layer 3 will not annihilate quickly so that the GTO fails to turn-off. Hence, in order to turn the GTO off the resistance $R_{so}$ must have a maximum value. It can therefore be said that the short-circuiting resistance $R_{so}$ has an optimal value for which the carriers in the $n_B$-layer 3 annihilate properly.

The short-circuiting resistance $R_{so}$ is a resistance of the $n_B$-layer 3 under thermal equilibrium condition. This is obtained by the following actual measurement between electrodes 6a and 7a in FIG. 3 for a GTO unit. Namely, in FIG. 3, the layer encircled by a solid line illustrates the $n_B$-layer 3. There are provided electrodes 6a and 7a, respectively at the portions of the $n_B$-layer 3 to which the anode electrode 6 is kept in ohmic contact and the $n_E$ layer 5 is projected toward the $n_B$ layer 3.

Figure 3:
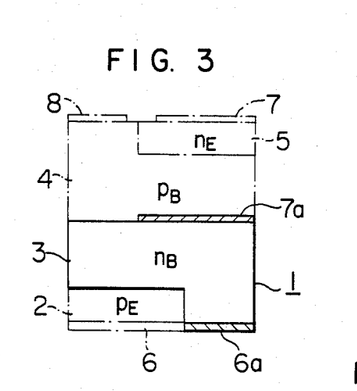
FIG. 3 is a diagram for explaining the short-circuiting resistance of the GTO unit.

When a fixed voltage is applied between both electrodes 6a and 7a and the fixed voltage is divided by the flowing current due to the voltage, the short-circuiting resistance $R_s$ is obtained.

When the short-circuiting resistance $R_s$ is intended to be obtained practically through calculation, the potentials of 1 volt and 0 volt are applied to the electrodes 6a and 7a, respectively. The potential $\psi$ per unit area in the $n_B$-layer 3 is obtained from the following Laplace's equation $$\frac{\partial^2 \psi}{\partial x^2} + \frac{\partial^2 \psi}{\partial y^2} = 0 \tag{9}$$

Where x represents positions in the direction parallel to the electrodes 6a and 7a while y represents positions in the direction perpendicular to the electrodes 6a and 7a. As a boundary condition, $\partial\psi/\partial t \neq 0$, $\partial\psi/\partial n=0$ when the component parallel to the boundary is t, the component perpendicular to the boundary is n. Namely, the $n_B$ layer 3 is surrounded by an insulating material except the electrodes 6a and 7a and surface current does not flow at the boundary. When the potential $\psi$ is divided by the predetermined resistivity $\rho_n$ of the $n_B$ layer, the current i per unit area is obtained. Thus, the current I flowing through the entire $n_B$ layer 3 is obtained from $\Sigma i$, and the voltage applied between both electrodes 6a and 7a is divided by the current I. When 1/I is calculated, the short-circuiting resistance $R_s$ is obtained. Then $R_{so}$, which is a normalized value expressed in units of $\Omega \cdot cm^2$, is obtained by multiplying $R_s$ by the whole area of the $N_B$-layer 3 in the x direction (i.e., parallel to the electrodes 6a and 7a). This whole area can be taken, for example, as the entire interface area between the $N_B$ layer 3 and the $P_B$ layer 4.

Namely, the distribution of the current i per unit area of the $n_B$ layer 3 is varied by the arrangement or pattern of the $p_E$ layer and $n_E$ layer 5. The current flowing through the $n_B$ layer 3 flows in the direction substantially perpendicular to both electrodes 6a and 7a. $\rho \cdot w$ is a value proportional to the resistance in the direction perpendicular to both electrodes 6a and 7a and $\rho_n/W$ is normally referred to as a sheet resistance which is proportional to the resistance in the direction parallel to both electrodes 6a and 7a. Actually, the flowing current is determined by the value of $\rho \cdot w$ with ratio of 70-80%. Thus, the short-circuiting resistance $R_{so}$ is regarded as a value proportional to $\rho \cdot w$, and is represented as follows using a geometrical factor k due to emitter pattern (hereinafter referred to as geometrical factor k of emitter) as a proportion constant since the current distribution is predetermined by the patterns of the $p_E$ layer 2 and $n_E$ layer 5.

$$R_{so} = k\rho_n W \tag{10}$$

Figure 4:
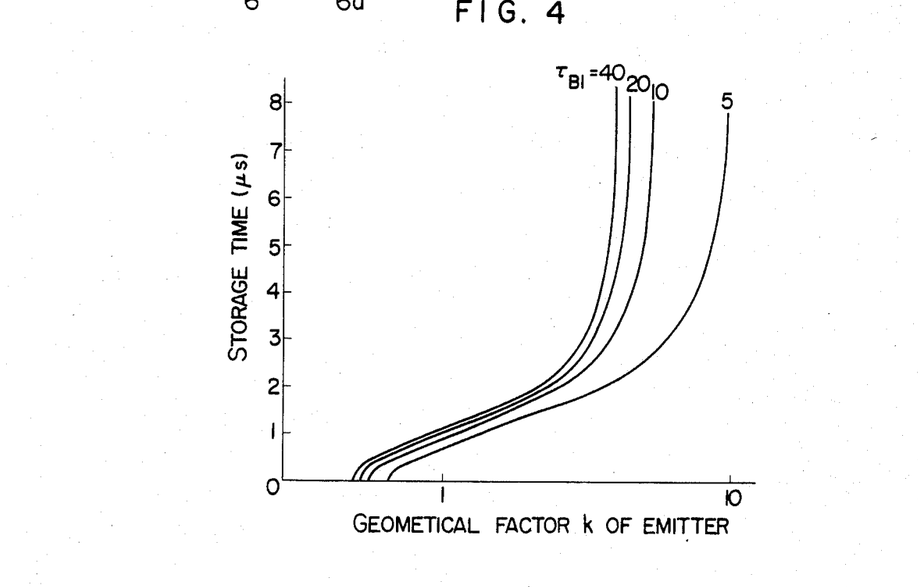
FIG. 4 shows in graphical representation the relationship between the geometrical factor k of the emitter and the storage time $t_s$, with the carrier life-time taken as a parameter.

FIG. 4 shows in graphical representation the relationship between the geometrical factor k of the emitter and the storage time $t_s$, with the life-time $\tau_{B1}$ of the carriers in the $n_B$-layer 3 taken as a parameter.

The geometrical factor k is a dimensionless constant since the dimension of the resistance $R_{so}$ is $\Omega \cdot cm^2$. The storage time $t_s$ is the period of time from the instant that the turn-off signal is applied to the GTO to the instant that the saturated condition of the pn junction defined between the $n_B$-layer 3 and the $p_B$-layer 4 has been broken, i.e. the instant of the turn-off operation starting.

FIG. 4 shows that if the geometrical factor k of emitter is too small, the storage time $t_s$ is negative. This means that the GTO cannot hold its on-state by itself. On the other hand, if the geometrical factor k of emitter is too large, the storage time $t_s$ is long. This means that the GTO cannot turn the load current off in a practical manner. Accordingly, the geometrical factor k of emitter must lie within an optimal range. For this purpose, the geometrical factor k of emitter must lie within a range between a certain minimum value $k_{min}$ and a certain maximum value $k_{max}$, so as to obtain good turn-off performance.

Further, since the storage time $t_s$ depends on not only the geometrical factor k but also the carrier life-time $\tau_{B1}$, the relationships between the carrier life-time $\tau_{B1}$ and the above mentioned limiting values $k_{min}$ and $k_{max}$ of the geometrical factor k can be obtained on the basis of the data shown in FIG. 4. The thus obtained relationships are shown in FIG. 5.

Figure 5:
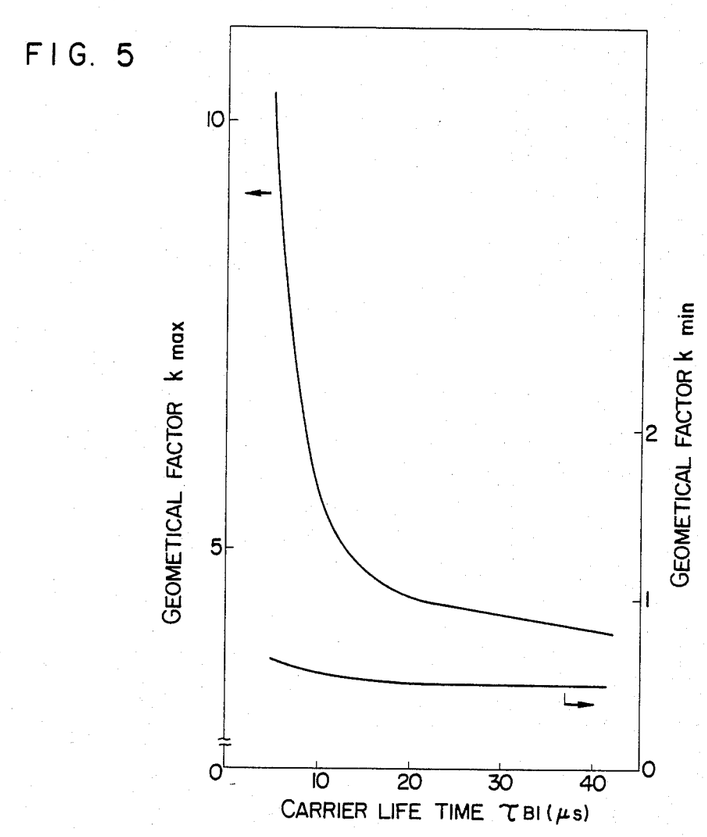
FIG. 5 shows in graphical representation the relationships between the carrier life-time $\tau_{B1}$ and the geometrical factor $k_{min}$ of the emitter and between the carrier life-time $\tau_{B1}$ and the geometrical factor $k_{max}$ of the emitter, derived on the basis of the characteristics shown in FIG. 4.

As seen from FIG. 5, it is observed that the value $k_{max}$ increases rapidly when the carrier life-time $\tau_{B1}$ is short and that $k_{max}$ remains almost constant for the carrier life-times of longer than 10 $\mu$sec. It is also observed that the value $k_{min}$ is changed little as $\tau_{B1}$ changes.

In an ordinary manufacturing process, the carrier life-time ranges from ten to several tens of $\mu$sec. unless the doping of life-time killer is effected. It is therefore understood that the characteristic of the GTO according to this invention is hardly affected by the small fluctuation of the carrier life-time in the manufacturing process.

As seen from FIG. 5, the limiting values $k_{min}$ and $k_{max}$ of the geometrical factor k are respectively represented as follows.

$$k_{min} = 0.498 \, (\log \tau_{B1} - 0.54)^{-1/7} \tag{11}$$

$$k_{max} = 3.937 \, (\log \tau_{B1} - 0.654)^{-0.3} \tag{12}$$

where log means the common logarithm to the base 10 and $\tau_{B1}$ is measured in $\mu$sec.

The substitution of the above expressions (11) and (12) for the expression (10) gives the following relations.

$$R_{so\,min} = 0.498 \, (\log \tau_{B1} - 0.54)^{-1/7} \cdot \rho_n W \tag{13}$$

$$R_{so\,max} = 3.937 \, (\log \tau_{B1} - 0.654)^{-0.3} \cdot \rho_n W \tag{14}$$

As described above, since a good turn-off performance can be obtained if the short-circuiting resistance $R_{so}$ lies within a proper range, the resistance $R_{so}$ is required to satisfy the following inequality which was obtained in view of the optimal range of the geometrical factor k.

$$R_{so\,min} < R_{so} < R_{so\,max} \tag{15}$$

Especially, it is preferable to modify the expression (10) as follows when considering a GTO having a breakover voltage of lower than 500 V.

$$R_{so} = k'\rho_n/W \tag{16}$$

where k' is the factor depending upon the geometrical patterns (i.e., relative dimensions and locations of the $p_E$-layer 2 and the $n_E$-layer 3). In that case it is also preferable to represent the minimum and the maximum values $k'_{min}$ and $k'_{max}$ of the geometrical factor $k'$ as follows.

$$k'_{min} = 7.165 \times 10^{-5} \times (\log \tau_{B1} - 0.54)^{-1/7} \quad (17)$$

$$k'_{max} = 5.665 \times 10^{-4} (\log \tau_{B1} - 0.654)^{-0.3} \quad (18)$$

The minimum and the maximum value $R_{so\ min}$ and $R_{so\ max}$ of the short-circuiting resistance $R_s$ result from the simple and self-evident mathematical treatment of the expressions (16)–(18), as follows $$R_{so\ min} = 7.165 \times 10^{-5} \times (\log \tau_{B1} - 0.54)^{-1/7} \times \rho_n/W \quad (19)$$

$$R_{so\ max} = 5.665 \times 10^{-4} \times (\log \tau_{B1} - 0.654)^{-0.3} \times \rho_n/W \quad (20)$$

The components of a semiconductor substrate in a semiconductor device are organically relative to each other. As for GTO, only the alteration of the patterns of the $p_E$ layer and $n_E$ layer may probably result in the change of current distribution and remarkable change of the turn-off characteristic thereof. An always new designing in the fabrication of GTO requires considerable amount of time and labors.

As long as the short-circuiting resistance is set to be within the range between $R_{so\ min}$ and $R_{so\ max}$ which are determined by the predetermined values of the life-time $\tau_{B1}$, resistivity $\rho_n$ and thickness $W$ of the $n_B$ layer, with the change of any other dimensions, good turn-off characteristic is obtained and there does not occur any problem of the increase of leak current and forward voltage drop which are resulted from the doping of life-time killer, and easiness of fabrication of GTO is also realized.

Next, the process of manufacturing a GTO according to this invention will be explained.

First, the life-time $\tau_{B1}$ of the carriers in the $n_B$-layer 3 is determined in the process of fabricating a GTO having a desired characteristic. By use of the expressions (11) and (12), the geometrical factor k of the emitter is calculated from the determined carrier life-time $\tau_{B1}$. Further, the resistivity $\rho_n$ and the thickness W of the $n_B$-layer 3 are obtained on the basis of the breakover voltage which the desired GTO should have. The short-circuiting resistance $R_{so}$ is obtained from the factor k, the resistivity $\rho_n$ and the thickness W by virtue of the expression (10). The thus obtained resistance $R_{so}$, which was obtained by the use of the expressions (11) and (12), satisfies the expression (15). Then, the dimensions of the respective layers 2–5 of the GTO are so determined as to give the above obtained value of $R_{so}$. Here, the design of the device is completed and hereafter it is only necessary to fabricate the desired GTO by the use of the well-known impurity diffusion techniques.

According to this invention, as described above, the attenuation factor of the charges in the $n_B$-layer 3 is made nearly equal to that of the conventional semiconductor switching device whose substrate is doped with life-time killer, by properly selecting the value of the short-circuiting resistance $R_{so}$, whereby a good turn-off performance is obtained. Since no life-time killer is doped, the on-state voltage $V_T$ is low, the leakage current is small and the breakover voltage and the turn-off performance at high temperatures do not deteriorate.

Further, the problem of the yield decreasing due to the doping of life-time killer is solved and the capacity of the GTO can be easily increased.

In addition, since the $p_E$-layer 2 is short-circuited with the $n_B$-layer 3 by the anode electrode 6, the current amplification factor $\alpha_{pnp}$ of the transistor $T_1$ shown in FIG. 2 is increased and also since no life-time killer is doped, the current amplification factor $\alpha_{npn}$ of the transistor $T_2$ is increased, so that the turn-off gain $\beta_{OFF}$ is also improved.

Now, the GTO's fabricated according to this invention will be described. The GTO shown in FIGS. 6 and 7 has a rated voltage of 600 V and a rated current of 5 A.

Figure 6:
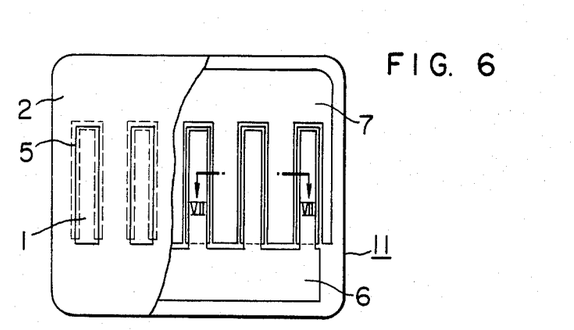
FIG. 6 shows in plan a GTO as an embodiment of this invention.
Figure 7:
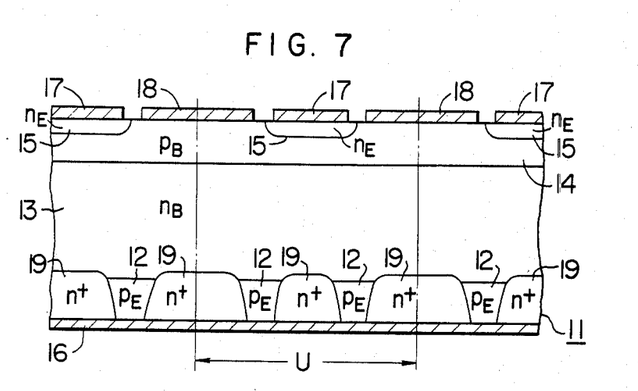
FIG. 7 is an enlarged, partial cross section taken along line VII—VII in FIG. 6.

By selectively diffusing a p-type and an n-type impurity successively into an n-type semiconductor substrate 11 having a resistivity of 30 $\Omega$·cm, a $p_E$-layer 12, a $p_B$-layer 14, an $n_E$-layer 15 and an n+-region 19 having a high impurity-concentration are formed and the portion where no impurity is diffused, serves as an $n_B$-layer 13. The upper exposed edge of the pn junction formed between the $p_B$-layer 14 and the $n_E$-layer 15 is covered with a glass layer (not shown) for surface passivation. An anode electrode 16, a cathode electrode 17 and a gate electrode 18 are provided and the thus prepared unit is mounted in a package and hermetically sealed.

The n+-region 19 having a high impurity-concentration serves to keep the anode electrode 16 in ohmic contact with the $n_B$-layer 13.

The $n_E$-layer 15 consists of five strip-shaped regions parallel disposed, each strip having a width of 240 $\mu$m and a length of 1300 $\mu$m. The $p_E$-layer 12 is provided corresponding to the $n_E$-layer 15 and has a width of 120 $\mu$m, also consisting of five regions each in the form of a flat-bottomed U, as shown in FIG. 6, and so disposed that the center line thereof may be in alignment with the pn junction formed between the $p_B$-layer 14 and the $n_E$-layer 15.

The geometrical factor k of emitter is set equal to about 0.78.

The $p_E$-layer 12 is 45 $\mu$m thick, the high impurity-concentration n+-region 19 50 $\mu$m thick, the $n_B$-layer 13 120 $\mu$m thick, the $p_B$-layer 14 20 $\mu$m thick and the $n_E$-layer 15 15 $\mu$m thick.

According to this invention, the region U indicated by long-and-short dash line in FIG. 6 functions as a single GTO unit. The dimensions of each of the regions of 12–15 and 19 are determined so that each GTO unit provides a predetermined short circuiting resistance $R_{so}$. This is because there are required the normal operation of all the GTO units and the prevention of current concentration due to the operation of only one or some of the GTO units. Namely, this embodiment is of such a construction that a plurality of GTO units are combined in one semiconductor substrate 11.

Brief explanation of the turn-on and turn-off in each GTO unit is made as follows. There is arranged an n+ region 19 immediately beneath the center portion of the $n_E$ layer 15, which is surrounded by the $p_E$ layer 12. Thus, at the time of turn-on, lowest potential is provided at the center of the $p_E$ layer 12 and so the carrier injection from the $p_E$ layer 12 easily occurs which leads swift turn-on. At the time of turn-off, the current flowed into the $n_E$ layer 15 is extracted out from the periphery of the $n_E$ layer 15 into the gate electrode 18, and ultimately the current concentrates on the center of the $n_E$ layer 15. However, there is arranged the n+ region 19 immediately beneath the center portion of the $n_E$ layer 19 and a kind of transistor is formed and so the carrier injection into the $p_E$ layer 12 does not occur which leads swift turn-off.

With the GTO having such a structure as described above and shown in FIGS. 6 and 7, the on-stage $V_T$ is lower than 1.5 V for a current of 5 A and the turn-off time and the turn-off gain $\beta_{OFF}$ for 30 A are 3 μsec and 5 respectively. The leakage current in the forward blocking state is smaller by the order of 10 than that of the conventional GTO whose substrate is doped with gold and the production yield can be as high as above 90%.

Figure 8:
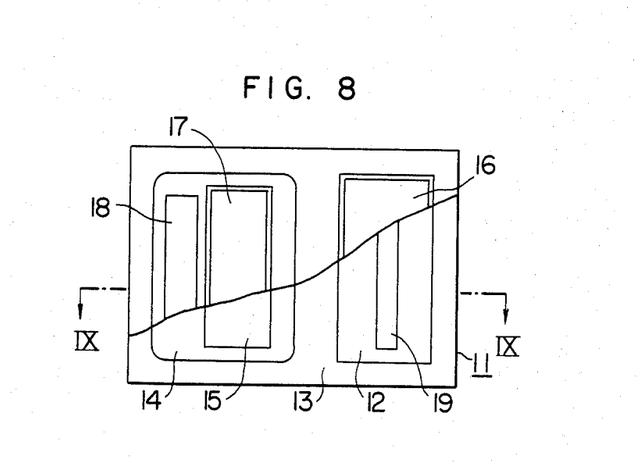
FIG. 8 shows in plan a GTO as another embodiment of this invention.
Figure 9:
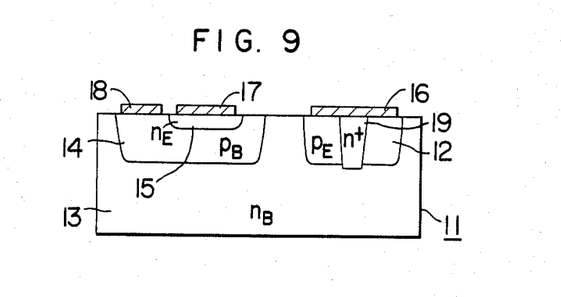
FIG. 9 is a cross section taken along line IX—IX in FIG. 8.

FIGS. 8 and 9 show a GTO as another embodiment of this invention. In this embodiment, the respective layers 12–15 and region 19 are laterally disposed and therefore the device readily lends itself to the integrated circuit configuration.

Throughout FIGS. 6 to 9 the same reference symbols indicate like or equivalent parts or components.

The adoption of the structure described above can make it easy to produce an IC for power amplification which has GTO's not capable of being constructed by conventional transistors.

In most cases of forming semiconductor IC's, gold is not diffused and therefore the semiconductor switching device according to this invention, which has a good turn-off performance without doping gold, can be said to lend itself to the IC configuration.

Next, the modifications of the GTO unit are explained with reference to the cross sectional view of FIG. 10 in which like elements designate like reference numerals in FIG. 7.

Figure 10A:
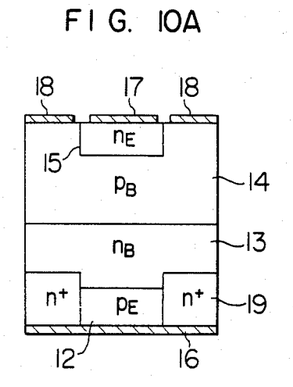
FIGS. 10A–10D schematically show in cross section modifications of GTO unit to which the present invention is applied.

In the modification of FIG. 10A, the $p_E$ layer 12 is arranged immediately beneath the $n_E$ layer 12.

Figure 10B:
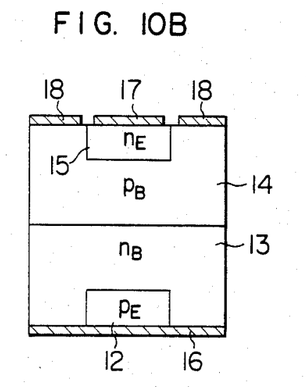

In the modification of FIG. 10B, the n+ region 19 is removed.

Figure 10C:
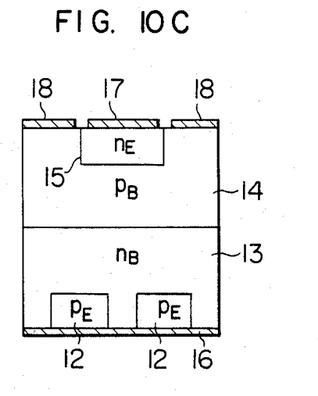

In the modification of FIG. 10C, the $p_E$ layer 12 is not arranged immediately beneath the $n_E$ layer 15 but arranged so as to surround the portion immediately beneath the $n_E$ layer 15 and the n+ region is not also arranged.

Figure 10D:
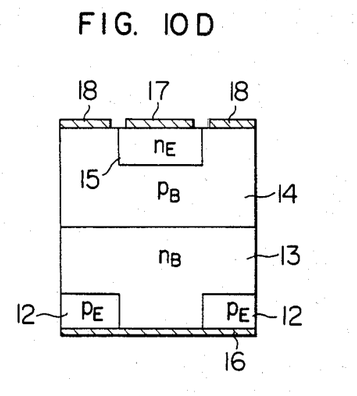

In the modification of FIG. 10D, the periphery of the $n_E$ layer slightly overlaps with the $p_E$ layer 12 and the n+ region is not provided.

In the several kinds of modification mentioned above, good turn-off operation can be obtained without the doping of life-time killer as long as the short-circuiting resistance of the $n_B$ layer 13 is within the predetermined range.

I claim:

1. A semiconductor switching device having a gate turn-off capability, comprising:
a semiconductor substrate including at least one gate turn-off thyristor unit comprising four semiconductor layers with alternately different conductivity types, a first main electrode kept in ohmic contact with a first outermost semiconductor layer of said four semiconductor layers, a control electrode kept in ohmic contact with a first inner semiconductor layer of said four semiconductor layers adjacent to said first outermost semiconductor layer, and a second main electrode kept in ohmic contact with a second outermost semiconductor layer of said four semiconductor layers and with an exposed area of a second inner semiconductor layer of said four semiconductor layers adjacent to said second outermost semiconductor layer, wherein a short-circuiting resistance $R_{so}(\Omega\cdot cm^2)$ between (a) an area on a first surface of the second inner semiconductor layer adjacent to the first inner semiconductor layer which area is a projection of said first outermost layer on said first surface of the second inner semiconductor layer and (b) said exposed area of said second inner semiconductor layer which is in contact with said second main electrode satisfies the following inequality in thermal equilibrium:

$$R_{so\ min} < R_{so} < R_{so\ max},$$

where $R_{so\ min}$ and $R_{so\ max}$ are the lower and upper limits of $R_{so}$, respectively, and $R_{so\ min}$ and $R_{so\ max}$ are also represented by the following expressions:

$$R_{so\ min} = 0.498\ (\log \tau_{B1} - 0.54)^{-1/7} \cdot \rho_n W \text{ and}$$

$$R_{so\ max} = 3.937\ (\log \tau_{B1} - 0.654)^{-0.3} \cdot \rho_n W,$$

where W and $\rho_n$ are the thickness (cm) and the resistivity ($\Omega\cdot cm$) of said second inner semiconductor layer respectively and $\tau_{B1}$ is the life-time (μsec) of the carrier in said second inner semiconductor layer.

2. A semiconductor switching device as claimed in claim 1, wherein said second inner semiconductor layer consists of a low impurity-concentration region adjacent to said first inner semiconductor layer and adjacent to said second outermost semiconductor layer and a high impurity-concentration region adjacent to said low impurity-concentration region and adjacent to said second outermost semiconductor layer, said second main electrode is disposed on said high impurity-concentration region and said second outermost semiconductor layer.

3. A semiconductor switching device having a gate turn-off capability, comprising:
a semiconductor substrate including plural gate turn-off thyristor units comprising four semiconductor layers with alternately different conductivity types, a first main electrode kept in ohmic contact with a first outermost semiconductor layer of said four semiconductor layers, a control electrode kept in ohmic contact with a first inner semiconductor layer of said four semiconductor layers adjacent to said first outermost semiconductor layer, and a second main electrode kept in ohmic contact with a second outermost semiconductor layer of said four semiconductor layers and with an exposed area of a second inner semiconductor layer of said four semiconductor layers adjacent to said second outermost semiconductor layer, wherein a short-circuiting resistance $R_{so}(\Omega\cdot cm^2)$ between (a) an area on a first surface of the second inner semiconductor layer adjacent to the first inner semiconductor layer which area is a projection of said first outermost layer on said first surface of the second inner semiconductor layer and (b) said exposed area of said second inner semiconductor layer which is in contact with said second main electrode satisfies the following inequality in thermal equilibrium:

$$R_{so\ min} < R_{so} < R_{so\ max},$$

where $R_{so\ min}$ and $R_{so\ max}$ are the lower and upper limits of $R_{so}$, respectively, and $R_{so\ min}$ and $R_{so\ max}$ are also represented by the following expressions.

$$R_{so\ min} = 0.498\ (\log \tau_{B1} - 0.54)^{-1/7} \cdot \rho_n W \text{ and}$$

$$R_{so\ max}=3.937\ (\log \tau_{B1}-0.654)^{-0.3}\cdot\rho_n W,$$

where W and $\rho_n$ are the thickness (cm) and the resistivity ($\Omega\cdot$cm) of said second inner semiconductor layer respectively and $\tau_{B1}$ is the life-time ($\mu$sec) of the carrier in said second inner semiconductor layer.

4. A semiconductor switching device as claimed in claim 3, wherein said second inner semiconductor consists of a low impurity-concentration region adjacent to said first inner semiconductor layer and adjacent to said second outermost semiconductor layer and a high impurity-concentration region adjacent to said low impurity-concentration region and adjacent to said second outermost semiconductor layer, said second main electrode is disposed on said high impurity-concentration region and said second outermost semiconductor layer.

5. A semiconductor switching device having a gate turn-off capability, comprising:

a semiconductor substrate including at least one gate turn-off thyristor unit comprising four semiconductor layers with alternately different conductivity types, a first main electrode kept in ohmic contact with a first outermost semiconductor layer of said four semiconductor layers, a control electrode kept in ohmic contact with a first inner semiconductor layer of said four semiconductor layers adjacent to said first outermost semiconductor layer, and a second main electrode kept in ohmic contact with a second outermost semiconductor layer of said four semiconductor layers and with an exposed area of a second inner semiconductor layer of said four semiconductor layers adjacent to said second outermost semiconductor layer, wherein a short-circuiting resistance surface of the second $R_{so}(\Omega\cdot$cm$^2)$ between (a) an area on a first surface of the second inner semiconductor layer adjacent to the first inner semiconductor layer which area is a projection of said first outermost layer on said first surface of the second inner semiconductor layer and (b) said exposed area of said second inner semiconductor layer which is in contact with said second main electrode satisfies the following inequality in thermal equilibrium:

$$R_{so\ min}<R_{so}<R_{so\ max},$$

where $R_{so\ min}$ and $R_{so\ max}$ are the lower and upper limits of $R_{so}$ respectively, and $R_{so\ min}$ and $R_{so\ max}$ are also represented by the following expressions $$R_{so\ min}=7.165\times10^{-5}\ (\log \tau_{B1}-0.54)^{-1/7}\cdot\rho_n/W$$
and
$$R_{so\ max}=5.665\times10^{-4}\ (\log \tau_{B1}-0.654)^{-0.3}\cdot\rho_n/W,$$

where W and $\rho_n$ are respectively the thickness (cm) and the resistivity ($\Omega\cdot$cm) of said second inner semiconductor layer and $\tau_{B1}$ is the life-time ($\mu$sec) of the carrier in said second inner semiconductor layer.

6. A semiconductor switching device as claimed in claim 5, wherein said second inner semiconductor consists of a low impurity-concentration region adjacent to said first inner semiconductor layer and adjacent to said second outermost semiconductor layer and a high impurity-concentration region adjacent to said low impurity-concentration region and adjacent to said second outermost semiconductor layer, said second main electrode is disposed on said high impurity-concentration region and said second outermost semiconductor layer.

7. A semiconductor switching device having a gate turn-off capability, comprising:

a semiconductor substrate including plural gate turn-off thyristor units comprising four semiconductor layers with alternately different conductivity types, a first main electrode kept in ohmic contact with a first outermost semiconductor layer of said four semiconductor layers, a control electrode kept in ohmic contact with a first inner semiconductor layer of said four semiconductor layers adjacent to said first outermost semiconductor layer, and a second main electrode kept in ohmic contact with a second outermost semiconductor layer of said four semiconductor layers and with an exposed area of a second inner semiconductor layer of said four semiconductor layers adjacent to said second outermost semiconductor layer, wherein a short-circuiting resistance $R_{so}(\Omega\cdot$cm$^2)$ between (a) an area on a first surface of the second inner semiconductor layer adjacent to the first inner semiconductor layer which area is a projection of said first outermost layer on said first surface of the second inner semiconductor layer and (b) said exposed area of said second inner semiconductor layer which is in contact with said second main electrode satisfies the following inequality in thermal equilibrium:

$$R_{so\ min}<R_{so}<R_{so\ max},$$

where $R_{so\ min}$ and $R_{so\ max}$ are the lower and upper limits of $R_{so}$, respectively, and $R_{so\ min}$ and $R_{so\ max}$ are also represented by the following expressions $$R_{so\ min}=7.165\times10^{-5}\ (\log \tau_{B1}-0.54)^{-1/7}\cdot\rho_n/W$$
and
$$R_{so\ max}=5.665\times10^{-4}\ (\log \tau_{B1}-0.654)^{-0.3}\cdot\rho_n/W,$$

where W and $\rho_n$ are respectively the thickness (cm) and the resistivity ($\Omega\cdot$cm) of said second inner semiconductor layer and $\tau_{B1}$ is the life-time ($\mu$sec) of the carrier in said second inner semiconductor layer.

8. A semiconductor switching device as claimed in claim 7, wherein said second inner semiconductor layer consists of a low impurity-concentration region adjacent to said first inner semiconductor layer and adjacent to said second outermost semiconductor layer and a high impurity-concentration region adjacent to said low impurity-concentration region and adjacent to said second outermost semiconductor layer, and said second main electrode is disposed on said high impurity-concentration region and said second outermost semiconductor layer.

9. A semiconductor switching device having a gate turn-off capability, comprising:

a semiconductor substrate including at least one gate turn-off thyristor unit comprising four semiconductor layers with alternately different conductivity types, a first main electrode kept in ohmic contact with a first outermost semiconductor layer of said four semiconductor layers, a control electrode kept in ohmic contact with a first inner semiconductor layer of said four semiconductor layers adjacent to said first outermost semiconductor layer, and a second main electrode kept in ohmic contact with a second outermost semiconductor layer of said four semiconductor layers and with an exposed area of a second inner semiconductor layer of said four semiconductor layers adjacent to said second outermost semiconductor layer, wherein a short-circuiting resistance $R_{so}$ ($\Omega \cdot cm^2$) between (a) a first area on a first surface of the second inner semiconductor layer adjacent to the first inner semiconductor layer which area is a projection of said first outermost layer on said first surface of the second inner semiconductor layer and (b) said exposed area of said second inner semiconductor layer which is in contact with said second main electrode as determined by (1) applying a predetermined potential difference between said first area on said first surface of said second inner semiconductor and said exposed area of said second inner semiconductor, (2) determining the potential $\psi$ per unit area in said second inner semiconductor resulting from applying said predetermined potential difference from the equation:

$$\frac{\partial^2 \psi}{\partial x^2} + \frac{\partial^2 \psi}{\partial y^2} = 0$$

where x represents positions in a direction parallel to the first area and the exposed area, and y represents positions in a direction perpendicular to the first area and the exposed area, (3) determining the current i per unit area by dividing the potential $\psi$ by a predetermined resistivity $\rho_n$ of the second inner semiconductor layer, (4) determining the total current I flowing through the second inner semiconductor layer by $I = \Sigma i$, (5) determining the short-circuiting resistance $R_s$ for the second inner semiconductor layer by dividing the predetermined potential difference by the total current I, and (6) determining the short-circuiting resistance $R_{so}$ expressed in units of $\Omega \cdot cm^2$ by multiplying the short-circuiting resistance $R_s$ by the entire area of the second inner semiconductor layer taken in the x direction, satisfies the following inequality in thermal equilibrium:

$$R_{so\ min} < R_{so} < R_{so\ max},$$

where $R_{so\ min}$ and $R_{so\ max}$ are the lower and upper limits of $R_{so}$, respectively, and $R_{so\ min}$ and $R_{so\ max}$ are also represented by the following expressions:

$$R_{so\ min} = 0.498\ (\log \tau_{B1} - 0.54)^{-1/7} \cdot \rho_n W \text{ and}$$

$$R_{so\ max} = 3.937\ (\log \tau_{B1} - 0.654)^{-0.3} \cdot \rho_n W,$$

where W and $\rho_n$ are the thickness (cm) and the resistivity ($\Omega \cdot cm$) of said second inner semiconductor layer respectively and $\tau_{B1}$ is the life-time ($\mu sec$) of the carrier in said second inner semiconductor layer.

10. A semiconductor switching device having a gate turn-off capability, comprising:

a semiconductor substrate including at least one gate turn-off thyristor unit comprising four semiconductor layers with alternately different conductivity types, a first main electrode kept in ohmic contact with a first outermost semiconductor layer of said four semiconductor layers, a control electrode kept in ohmic contact with a first inner semiconductor layer of said four semiconductor layers adjacent to said first outermost semiconductor layer, and a second main electrode kept in ohmic contact with a second outermost semiconductor layer of said four semiconductor layers and with an exposed area of a second inner semiconductor layer of said four semiconductor layers adjacent to said second outermost semiconductor layer, wherein a short-circuiting resistance $R_{so}$($\Omega \cdot cm^2$) between (a) a first area on a first surface of the second inner semiconductor layer adjacent to the first inner semiconductor layer which area is a projection of said first outermost layer on said first surface of the second inner semiconductor layer and (b) said exposed area of said second inner semiconductor layer which is in contact with said second main electrode as determined by (1) applying a predetermined potential difference between said first area on said first surface of said second inner semiconductor and said exposed area of said second inner semiconductor, (2) determining the potential $\psi$ per unit area in said second inner semiconductor resulting from applying said predetermined potential difference from the equation:

$$\alpha^2 \psi / \alpha x^2 + \alpha^2 \psi / \alpha y^2 = 0$$

where x represents positions in a direction parallel to the first area and the exposed area, and y represents positions in a direction perpendicular to the first area and the exposed area, (3) determining the current i per unit area dividing the potential $\psi$ by a predetermined resistivity $\rho_n$ of the second inner semiconductor layer, (4) determining the total current I flowing through the second inner semiconductor layer by $I = \epsilon i$, (5) determining the short-circuiting resistance $R_s$ for the second inner semiconductor layer by dividing the predetermined potential difference by the total current I, and (6) determining the short-circuiting resistance $R_{so}$ expressed in units of $\Omega \cdot cm^2$ by multiplying the short-circuiting resistance $R_s$ by the entire area of the second inner semiconductor layer taken in the x direction, satisfies the following inequality in thermal equilibrium:

$$R_{so\ min} < R_{so} < R_{so\ max},$$

where $R_{so\ min}$ and $R_{so\ max}$ are the lower and upper limits of $R_{so}$, respectively, and $R_{so\ min}$ and $R_{so\ max}$ are also represented by the following expressions:

$$R_{so\ min} = 7.165 \times 10^{-5} (\log \tau_{B1} - 0.54)^{1/7} \cdot \rho_n / W$$

and $$R_{so\ max} = 5.665 \times 10^{-4} (\log \tau_{B1} - 0.654)^{-0.3} \cdot \rho_n / W,$$

where W and $\rho_n$ are respectively the thickness (cm) and the resistivity ($\Omega \cdot cm$) of said second inner semiconductor layer and $\tau_{B1}$ is the life-time ($\mu sec$) of the carrier in said second inner semiconductor layer.

* * * * *